US010074755B2

(12) United States Patent
Yang et al.

(10) Patent No.: US 10,074,755 B2
(45) Date of Patent: Sep. 11, 2018

(54) HIGH EFFICIENCY SOLAR PANEL

(71) Applicant: Silevo, Inc., Fremont, CA (US)

(72) Inventors: Bobby Yang, Los Altos Hills, CA (US);
Peter P. Nguyen, San Jose, CA (US);
Jiunn Benjamin Heng, San Jose, CA (US); Anand J. Reddy, Castro Valley, CA (US); Zheng Xu, Pleasanton, CA (US)

(73) Assignee: Tesla, Inc., Palo Alto, CA (US)

( * ) Notice: Subject to any disclaimer, the term of this patent is extended or adjusted under 35 U.S.C. 154(b) by 478 days.

(21) Appl. No.: 14/563,867

(22) Filed: Dec. 8, 2014

(65) Prior Publication Data

US 2015/0090314 A1 Apr. 2, 2015

Related U.S. Application Data

(63) Continuation-in-part of application No. 14/510,008, filed on Oct. 8, 2014, now Pat. No. 9,412,884, which
(Continued)

(51) Int. Cl.
*H01L 31/02* (2006.01)
*H01L 31/05* (2014.01)
(Continued)

(52) U.S. Cl.
CPC .... *H01L 31/022433* (2013.01); *H01L 31/042* (2013.01); *H01L 31/0504* (2013.01);
(Continued)

(58) Field of Classification Search
CPC ............... H01L 31/02; H01L 31/02002; H01L 31/0201; H01L 31/02016; H01L 31/0224;
(Continued)

(56) References Cited

U.S. PATENT DOCUMENTS

| 819,360 A | 3/1902 | Mayer |
| 2,626,907 A | 1/1953 | Melvin De Groote |

(Continued)

FOREIGN PATENT DOCUMENTS

| CN | 101553933 | 10/2009 |
| CN | 100580957 C | 1/2010 |

(Continued)

OTHER PUBLICATIONS

Parthavi, "Doping by Diffusion and Implantation", <http://www.leb.eei.uni-erlangen.de/winterakademie/2010/report/course03/pdf/0306.pdf>.
(Continued)

*Primary Examiner* — Susan D Leong
(74) *Attorney, Agent, or Firm* — Shun Yao; Park, Vaughan, Fleming & Dowler LLP

(57) ABSTRACT

One embodiment of the present invention provides a solar panel. The solar panel includes a plurality of subsets of solar cells. The solar cells in a subset are coupled in series, and the subsets of solar cells are coupled in parallel. The number of solar cells in a respective subset is sufficiently large such that the output voltage of the solar panel is substantially the same as an output voltage of a conventional solar panel with all of its substantially square shaped solar cells coupled in series.

9 Claims, 12 Drawing Sheets

Related U.S. Application Data is a continuation-in-part of application No. 14/153,608, filed on Jan. 13, 2014, now Pat. No. 9,219,174.

(60) Provisional application No. 62/075,134, filed on Nov. 4, 2014, provisional application No. 61/751,733, filed on Jan. 11, 2013.

(51) Int. Cl.
*H01L 31/0224* (2006.01)
*H01L 31/042* (2014.01)
*H01L 31/0747* (2012.01)

(52) U.S. Cl.
CPC .. *H01L 31/0747* (2013.01); *H01L 2933/0033* (2013.01); *Y02E 10/50* (2013.01)

(58) Field of Classification Search
CPC ......... H01L 31/022433; H01L 31/0352; H01L 31/042; H01L 31/0463; H01L 31/0465; H01L 31/05; H01L 31/0504; H01L 31/0747
See application file for complete search history.

(56) References Cited

U.S. PATENT DOCUMENTS

| | | |
|---|---|---|
| 2,938,938 A | 5/1960 | Dickson |
| 3,094,439 A | 6/1963 | Mann et al. |
| 3,116,171 A | 12/1963 | Nielson |
| 3,459,597 A | 8/1969 | Baron |
| 3,676,179 A | 7/1972 | Bokros |
| 3,961,997 A | 6/1976 | Chu |
| 3,969,163 A | 7/1976 | Wakefield |
| 4,015,280 A | 3/1977 | Matsushita |
| 4,082,568 A | 4/1978 | Lindmayer |
| 4,124,410 A | 11/1978 | Kotval |
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder et al. |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann et al. |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A | 9/1986 | Hamakawa |
| 4,617,421 A | 10/1986 | Nath |
| 4,633,033 A | 12/1986 | Nath |
| 4,652,693 A | 3/1987 | Bar-On |
| 4,657,060 A | 4/1987 | Kaucic |
| 4,667,060 A | 5/1987 | Spitzer |
| 4,694,115 A | 9/1987 | Lillington |
| 4,729,970 A | 3/1988 | Nath |
| 4,753,683 A | 6/1988 | Ellion |
| 4,771,017 A | 9/1988 | Tobin |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,057,163 A | 10/1991 | Barnett |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Floedl |
| 5,155,051 A | 10/1992 | Noguchi |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,808,315 A | 9/1998 | Murakami |
| 5,814,195 A | 9/1998 | Lehan |
| 5,903,382 A | 5/1999 | Tench |
| 5,935,345 A | 8/1999 | Kuznicki |
| 6,017,581 A | 1/2000 | Hooker |
| 6,034,322 A | 3/2000 | Pollard |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,761,771 B2 | 7/2004 | Satoh |
| 6,803,513 B2 | 10/2004 | Beernink |
| 6,841,051 B2 | 1/2005 | Crowley |
| 7,030,413 B2 | 4/2006 | Nakamura |
| 7,128,975 B2 | 10/2006 | Inomata |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German |
| 7,977,220 B2 | 7/2011 | Sanjurjo |
| 8,070,925 B2 | 12/2011 | Hoffman |
| 8,115,093 B2 | 2/2012 | Gui |
| 8,119,901 B2 | 2/2012 | Jang |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |

(56) References Cited

U.S. PATENT DOCUMENTS

| | | |
|---|---|---|
| 9,147,788 B2 | 9/2015 | DeGroot |
| 9,287,431 B2 | 3/2016 | Mascarenhas |
| 9,761,744 B2 | 9/2017 | Wang |
| 2001/0008143 A1 | 7/2001 | Sasaoka |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes |
| 2003/0070705 A1 | 4/2003 | Hayden |
| 2003/0097447 A1 | 5/2003 | Johnston |
| 2003/0116185 A1 | 6/2003 | Oswald |
| 2003/0118865 A1 | 6/2003 | Marks |
| 2003/0121228 A1 | 7/2003 | Stoehr |
| 2003/0136440 A1 | 7/2003 | Machida |
| 2003/0168578 A1 | 9/2003 | Taguchi |
| 2003/0183270 A1 | 10/2003 | Falk |
| 2003/0201007 A1 | 10/2003 | Fraas |
| 2004/0035458 A1 | 2/2004 | Beernink |
| 2004/0065363 A1 | 4/2004 | Fetzer |
| 2004/0103937 A1 | 6/2004 | Bilyalov |
| 2004/0112419 A1* | 6/2004 | Boulanger ............... B64G 1/44 136/244 |
| 2004/0112426 A1 | 6/2004 | Hagino |
| 2004/0123897 A1 | 7/2004 | Ojima |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira |
| 2005/0022746 A1 | 2/2005 | Lampe |
| 2005/0022861 A1 | 2/2005 | Rose |
| 2005/0061665 A1 | 3/2005 | Pavani |
| 2005/0062041 A1 | 3/2005 | Terakawa |
| 2005/0074954 A1 | 4/2005 | Yamanaka |
| 2005/0109388 A1 | 5/2005 | Murakami |
| 2005/0126622 A1 | 6/2005 | Mukai |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |
| 2005/0257823 A1 | 11/2005 | Zwanenburg |
| 2005/0268963 A1 | 12/2005 | Jordan |
| 2006/0012000 A1 | 1/2006 | Estes |
| 2006/0060238 A1 | 3/2006 | Hacke |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0260673 A1* | 11/2006 | Takeyama ....... H01L 31/022425 136/252 |
| 2006/0272698 A1 | 12/2006 | Durvasula |
| 2006/0283496 A1 | 12/2006 | Okamoto |
| 2006/0283499 A1 | 12/2006 | Terakawa |
| 2007/0023081 A1 | 2/2007 | Johnson |
| 2007/0023082 A1 | 2/2007 | Manivannan |
| 2007/0108437 A1 | 5/2007 | Tavkhelidze |
| 2007/0132034 A1 | 6/2007 | Curello |
| 2007/0137699 A1 | 6/2007 | Manivannan |
| 2007/0148336 A1 | 6/2007 | Bachrach |
| 2007/0186853 A1 | 8/2007 | Gurary |
| 2007/0186968 A1 | 8/2007 | Nakauchi |
| 2007/0186970 A1 | 8/2007 | Takahashi |
| 2007/0187652 A1 | 8/2007 | Konno |
| 2007/0202029 A1 | 8/2007 | Burns |
| 2007/0235077 A1 | 10/2007 | Nagata |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann |
| 2007/0283997 A1 | 12/2007 | Hachtmann |
| 2008/0000522 A1 | 1/2008 | Johnson |
| 2008/0011350 A1* | 1/2008 | Luch ................ H01L 31/022425 136/249 |
| 2008/0035489 A1 | 2/2008 | Allardyce |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar |
| 2008/0053519 A1 | 3/2008 | Pearce |
| 2008/0061293 A1 | 3/2008 | Ribeyron |
| 2008/0092947 A1 | 4/2008 | Lopatin |
| 2008/0121272 A1 | 5/2008 | Besser |
| 2008/0121276 A1 | 5/2008 | Lopatin |
| 2008/0121932 A1 | 5/2008 | Ranade |
| 2008/0128013 A1 | 6/2008 | Lopatin |
| 2008/0128017 A1 | 6/2008 | Ford |
| 2008/0149161 A1 | 6/2008 | Nishida |
| 2008/0149163 A1 | 6/2008 | Gangemi |
| 2008/0156370 A1 | 7/2008 | Abdallah |
| 2008/0173347 A1 | 7/2008 | Korevaar |
| 2008/0173350 A1 | 7/2008 | Choi |
| 2008/0196757 A1 | 8/2008 | Yoshimine |
| 2008/0202577 A1* | 8/2008 | Hieslmair ............ H01L 31/1804 136/244 |
| 2008/0202582 A1 | 8/2008 | Noda |
| 2008/0216891 A1 | 9/2008 | Harkness |
| 2008/0223439 A1* | 9/2008 | Deng ...................... C25B 1/003 136/258 |
| 2008/0230122 A1 | 9/2008 | Terakawa |
| 2008/0251114 A1 | 10/2008 | Tanaka |
| 2008/0251117 A1 | 10/2008 | Schubert |
| 2008/0264477 A1 | 10/2008 | Moslehi |
| 2008/0276983 A1 | 11/2008 | Drake |
| 2008/0283115 A1 | 11/2008 | Fukawa |
| 2008/0302030 A1 | 12/2008 | Stancel |
| 2008/0303503 A1 | 12/2008 | Wolfs |
| 2008/0308145 A1 | 12/2008 | Krasnov |
| 2009/0007965 A1 | 1/2009 | Rohatgi |
| 2009/0014055 A1* | 1/2009 | Beck ................ H01L 31/02168 136/246 |
| 2009/0056805 A1 | 3/2009 | Barnett |
| 2009/0065043 A1 | 3/2009 | Hadorn |
| 2009/0078318 A1 | 3/2009 | Meyers |
| 2009/0084439 A1 | 4/2009 | Lu |
| 2009/0101872 A1 | 4/2009 | Young |
| 2009/0120492 A1 | 5/2009 | Sinha |
| 2009/0139512 A1 | 6/2009 | Lima |
| 2009/0151771 A1 | 6/2009 | Kothari |
| 2009/0151783 A1 | 6/2009 | Lu |
| 2009/0160259 A1 | 6/2009 | Ravindranath |
| 2009/0188561 A1 | 7/2009 | Aiken |
| 2009/0194233 A1 | 8/2009 | Tamura |
| 2009/0221111 A1 | 9/2009 | Frolov |
| 2009/0229854 A1 | 9/2009 | Fredenberg |
| 2009/0239331 A1 | 9/2009 | Xu |
| 2009/0250108 A1 | 10/2009 | Zhou |
| 2009/0255574 A1 | 10/2009 | Yu |
| 2009/0272419 A1 | 11/2009 | Sakamoto |
| 2009/0283138 A1 | 11/2009 | Lin |
| 2009/0283145 A1 | 11/2009 | Kim |
| 2009/0293948 A1 | 12/2009 | Tucci |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman |
| 2010/0043863 A1 | 2/2010 | Wudu |
| 2010/0065111 A1 | 3/2010 | Fu |
| 2010/0068890 A1 | 3/2010 | Stockum |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu |

(56) References Cited

U.S. PATENT DOCUMENTS

| | | |
|---|---|---|
| 2010/0131108 A1 | 5/2010 | Meyer |
| 2010/0132774 A1 | 6/2010 | Borden |
| 2010/0132792 A1 | 6/2010 | Kim |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0229914 A1 | 9/2010 | Adriani |
| 2010/0236612 A1 | 9/2010 | Khajehoddin |
| 2010/0240172 A1 | 9/2010 | Rana |
| 2010/0243021 A1 | 9/2010 | Lee |
| 2010/0269904 A1 | 10/2010 | Cousins |
| 2010/0279492 A1 | 11/2010 | Yang |
| 2010/0300506 A1 | 12/2010 | Heng |
| 2010/0300507 A1 | 12/2010 | Heng |
| 2010/0300525 A1 | 12/2010 | Lim |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0023958 A1 | 2/2011 | Masson |
| 2011/0030777 A1 | 2/2011 | Lim |
| 2011/0048491 A1 | 3/2011 | Taira |
| 2011/0073175 A1 | 3/2011 | Hilali |
| 2011/0088762 A1 | 4/2011 | Singh |
| 2011/0120518 A1* | 5/2011 | Rust ............ H01L 31/042 136/244 |
| 2011/0146759 A1 | 6/2011 | Lee |
| 2011/0146781 A1 | 6/2011 | Laudisio |
| 2011/0156188 A1 | 6/2011 | Tu |
| 2011/0168250 A1 | 7/2011 | Lin |
| 2011/0168261 A1 | 7/2011 | Welser |
| 2011/0174374 A1 | 7/2011 | Harder |
| 2011/0186112 A1 | 8/2011 | Aernouts |
| 2011/0220182 A1 | 9/2011 | Lin |
| 2011/0259419 A1 | 10/2011 | Hagemann |
| 2011/0272012 A1 | 11/2011 | Heng et al. |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch |
| 2011/0308573 A1 | 12/2011 | Jaus |
| 2012/0000502 A1 | 1/2012 | Wiedeman |
| 2012/0012153 A1 | 1/2012 | Azechi |
| 2012/0012174 A1 | 1/2012 | Wu |
| 2012/0028461 A1 | 2/2012 | Ritchie |
| 2012/0031480 A1 | 2/2012 | Tisler |
| 2012/0040487 A1 | 2/2012 | Asthana |
| 2012/0042925 A1 | 2/2012 | Pfennig |
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Beitel et al. |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0152752 A1 | 6/2012 | Keigler |
| 2012/0167986 A1 | 7/2012 | Meakin |
| 2012/0192932 A1 | 8/2012 | Wu |
| 2012/0199184 A1 | 8/2012 | Nie |
| 2012/0240995 A1 | 9/2012 | Coakley |
| 2012/0248497 A1 | 10/2012 | Zhou |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng |
| 2012/0319253 A1 | 12/2012 | Mizuno |
| 2012/0325282 A1 | 12/2012 | Snow |
| 2013/0000705 A1 | 1/2013 | Shappir |
| 2013/0014802 A1 | 1/2013 | Zimmerman |
| 2013/0019919 A1* | 1/2013 | Hoang ............ H01L 31/022433 136/244 |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0160826 A1 | 6/2013 | Beckerman |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2013/0306128 A1 | 11/2013 | Kannou |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0120699 A1 | 5/2014 | Hua |
| 2014/0124013 A1 | 5/2014 | Morad et al. |
| 2014/0124014 A1 | 5/2014 | Morad et al. |
| 2014/0154836 A1 | 6/2014 | Kim |
| 2014/0196768 A1 | 7/2014 | Heng |
| 2014/0242746 A1 | 8/2014 | Albadri |
| 2014/0261624 A1* | 9/2014 | Cruz-Campa ............ H01L 31/18 136/246 |
| 2014/0299187 A1 | 10/2014 | Chang |
| 2014/0318611 A1 | 10/2014 | Moslehi |
| 2014/0345674 A1 | 11/2014 | Yang |
| 2014/0349441 A1 | 11/2014 | Fu |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0144180 A1 | 5/2015 | Baccini |
| 2015/0171230 A1 | 6/2015 | Kapur |
| 2015/0214409 A1 | 7/2015 | Pfeiffer |
| 2015/0236177 A1 | 8/2015 | Fu |
| 2015/0270410 A1 | 9/2015 | Heng |
| 2015/0280641 A1 | 10/2015 | Garg |
| 2015/0340531 A1 | 11/2015 | Hayashi |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0163888 A1 | 6/2016 | Reddy |
| 2016/0190354 A1 | 6/2016 | Agrawal |
| 2016/0204289 A1 | 7/2016 | Tao |
| 2016/0322513 A1 | 11/2016 | Martin |
| 2016/0329443 A1 | 11/2016 | Wang |

(56) References Cited

U.S. PATENT DOCUMENTS

| | | |
|---|---|---|
| 2017/0084766 A1 | 3/2017 | Yang |
| 2017/0222082 A1 | 8/2017 | Lin |

FOREIGN PATENT DOCUMENTS

| | | |
|---|---|---|
| CN | 102263157 | 11/2011 |
| CN | 104409402 | 3/2015 |
| DE | 4030713 | 4/1992 |
| DE | 102006009194 | 8/2007 |
| DE | 202007002897 | 8/2008 |
| DE | 102010061317 | 6/2012 |
| DE | 10201201051 | 11/2013 |
| DE | 102012010151 | 11/2013 |
| EP | 1770791 | 4/2007 |
| EP | 1806684 | 8/2007 |
| EP | 2071635 | 6/2009 |
| EP | 2113946 | 11/2009 |
| EP | 2362430 | 8/2011 |
| EP | 2385561 | 11/2011 |
| EP | 2385561 A2 | 11/2011 |
| EP | 2387079 | 11/2011 |
| EP | 2479796 A1 | 7/2012 |
| EP | 2626907 A1 | 8/2013 |
| EP | 2479796 | 7/2015 |
| EP | 2626907 | 8/2015 |
| JP | H04245683 A | 9/1992 |
| JP | 06196766 | 7/1994 |
| JP | H07249788 A | 9/1995 |
| JP | 10004204 | 1/1998 |
| JP | H1131834 | 2/1999 |
| JP | 2000164902 | 6/2000 |
| JP | 2002057357 A | 2/2002 |
| JP | 2005159312 A | 6/2005 |
| JP | 2006324504 | 11/2006 |
| JP | 2008135655 | 6/2008 |
| JP | 2009054748 | 3/2009 |
| JP | 2009177225 | 8/2009 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 20050122721 A | 12/2005 |
| KR | 20060003277 A | 1/2006 |
| KR | 20090011519 A | 2/2009 |
| WO | 1991017839 | 11/1991 |
| WO | 9120097 A1 | 12/1991 |
| WO | 2003083953 A1 | 10/2003 |
| WO | 2006097189 A1 | 9/2006 |
| WO | 2008089657 | 7/2008 |
| WO | 2009094578 | 7/2009 |
| WO | 2009150654 | 12/2009 |
| WO | 2009150654 A2 | 12/2009 |
| WO | 2010070015 | 6/2010 |
| WO | 2010075606 | 7/2010 |
| WO | 2010075606 A1 | 7/2010 |
| WO | 2010104726 A2 | 9/2010 |
| WO | 2010123974 | 10/2010 |
| WO | 2010123974 A1 | 10/2010 |
| WO | 2011005447 | 1/2011 |
| WO | 2011005447 A2 | 1/2011 |
| WO | 2011008881 | 1/2011 |
| WO | 2011008881 A2 | 1/2011 |
| WO | 2011053006 | 5/2011 |
| WO | 2011123646 A2 | 10/2011 |
| WO | 2013020590 | 2/2013 |
| WO | 2013020590 A1 | 2/2013 |
| WO | 2010085949 | 3/2013 |
| WO | 2013046351 | 4/2013 |
| WO | 2014066265 | 5/2014 |
| WO | 2014074826 | 7/2014 |
| WO | 2014110520 | 7/2014 |
| WO | 2014117138 | 7/2014 |
| WO | 2015183827 | 12/2015 |
| WO | 2016090332 | 6/2016 |

OTHER PUBLICATIONS

Weiss, "Development of different copper seed layers with respect to the copper electroplating process," Microelectronic Engineering 50 (2000) 443-440, Mar. 15, 2000.

Tomasi, "Back-contacted Silicon Heterojunction Solar Cells With Efficiency>21%" 2014 IEEE.

Hornbachner et al., "Cambered Photovoltaic Module and Method for its Manufacture" Jun. 17, 2009.

Machine translation of JP 10004204 A, Shindou et al.

Beaucarne G et al: 'Epitaxial thin-film Si solar cells' Thin Solid Films, Elsevier-Sequoia S.A. Lausanne, CH LNKD-DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].

Chabal, Yves J. et al., 'Silicon Surface and Interface Issues for Nanoelectronics,' The Electrochemical Society Interface, Spring 2005, pp. 31-33.

Collins English Dictionary (Convex. (2000). In Collins English Dictionary. http://search.credoreference.com/content/entry/hcengdict/convex/0 on Oct. 18, 2014).

CUI, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20l.pptx> and converted to PDF.

Davies, P.C.W., 'Quantum tunneling time,' Am. J. Phys. 73, Jan. 2005, pp. 23-27.

Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.

Green, Martin A. et al., 'High-Efficiency Silicon Solar Cells,' IEEE Transactions on Electron Devices, vol. ED-31, No. 5, May 1984, pp. 679-683.

Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.

JCS Pires, J Otubo, AFB Braga, PR Mei; The purification of metallurgical grade silicon by electron beam melting, J of Mats Process Tech 169 (2005) 16-20.

Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.

Merriam-Webster online dictionary—"mesh". (accessed Oct. 8, 2012).

Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.

Mueller, Thomas, et al. "High quality passivation for heteroj unction solar cells by hydrogenated amorphous silicon suboxide films." Applied Physics Letters 92.3 (2008): 033504-033504.

Munzer, K.A. "High Throughput Industrial In-Line Boron BSF Diffusion" Jun. 2005. 20th European Photovoltaic Solar Energy Conference, pp. 777-780.

National Weather Service Weather Forecast Office ("Why Do We have Seasons?" http://www.crh.noaa.gov/lmk/?n=seasons Accessed Oct. 18, 2014).

O'Mara, W.C.; Herring, R.B.; Hunt L.P. (1990). Handbook of Semiconductor Silicon Technology. William Andrew Publishing/Noyes. pp. 275-293.

Roedern, B. von, et al., 'Why is the Open-Circuit Voltage of Crystalline Si Solar Cells so Critically Dependent on Emitter- and Base-Doping?' Presented at the 9th Workshop on Crystalline Silicon Solar Cell Materials and Processes, Breckenridge, CO, Aug. 9-11, 1999.

(56) References Cited

OTHER PUBLICATIONS

Stangl et al., Amorphous/Crystalline Silicon heterojunction solar cells—a simulation study; 17th European Photovoltaic Conference, Munich, Oct. 2001.
Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.
WP Leroy et al., "In Search for the Limits of Rotating Cylindrical Magnetron Sputtering", Magnetron, ION Processing and ARC Technologies European Conference, Jun. 18, 2010, pp. 1-32.
Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.
Jianhua Zhao et al. "24% Efficient perl silicon solar cell: Recent improvements in high efficiency silicon cell research".
"Nonequilibrium boron doping effects in low-temperature epitaxial silicon" Meyerson et al., Appl. Phys. Lett. 50 (2), p. 113 (1987).
"Doping Diffusion and Implantation" Parthavi, <http://www.leb.eei.uni-erlangen.de/winterakademie/2010/report/content/course03/pdf/0306.pdf>.
Kanani, Nasser. Electroplating: Basic Principles, Processes and Practice, Chapter 8—"Coating Thickness and its Measurement," 2004, pp. 247-291.
P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.
L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.
Meyerson et al. "Nonequilibrium boron doping effects in low-temperature epitaxial silicon", Appl. Phys. Lett. 50 (2), p. 113 (1987).
Li, "Surface and Bulk Passsivation of Multicrystalline Silicon Solar Cells by Silicon Nitride (H) Layer: Modeling and Experiments", Ph.D. dissertation, N.J. Inst. of Tech., Jan. 2009.
Electrically Conductive Foil Tape for Bus Bar Components in Photovoltaic Modules, Adhesives Research, http://www.adhesivesresearch.com/electrically-conductive-foil-tape-for-bus-bar-components-in-photovoltaic-modules/, accessed Oct. 12, 2017.
Geissbuhler et al., Silicon Heterojunction solar Cells with Copper-Plated Grid Electrodes: Status and Comparison with Silver Thick-Film Techniques, IEEE Journal of Photovoltaics, vol. 4, No. 4, Jul. 2014.

* cited by examiner

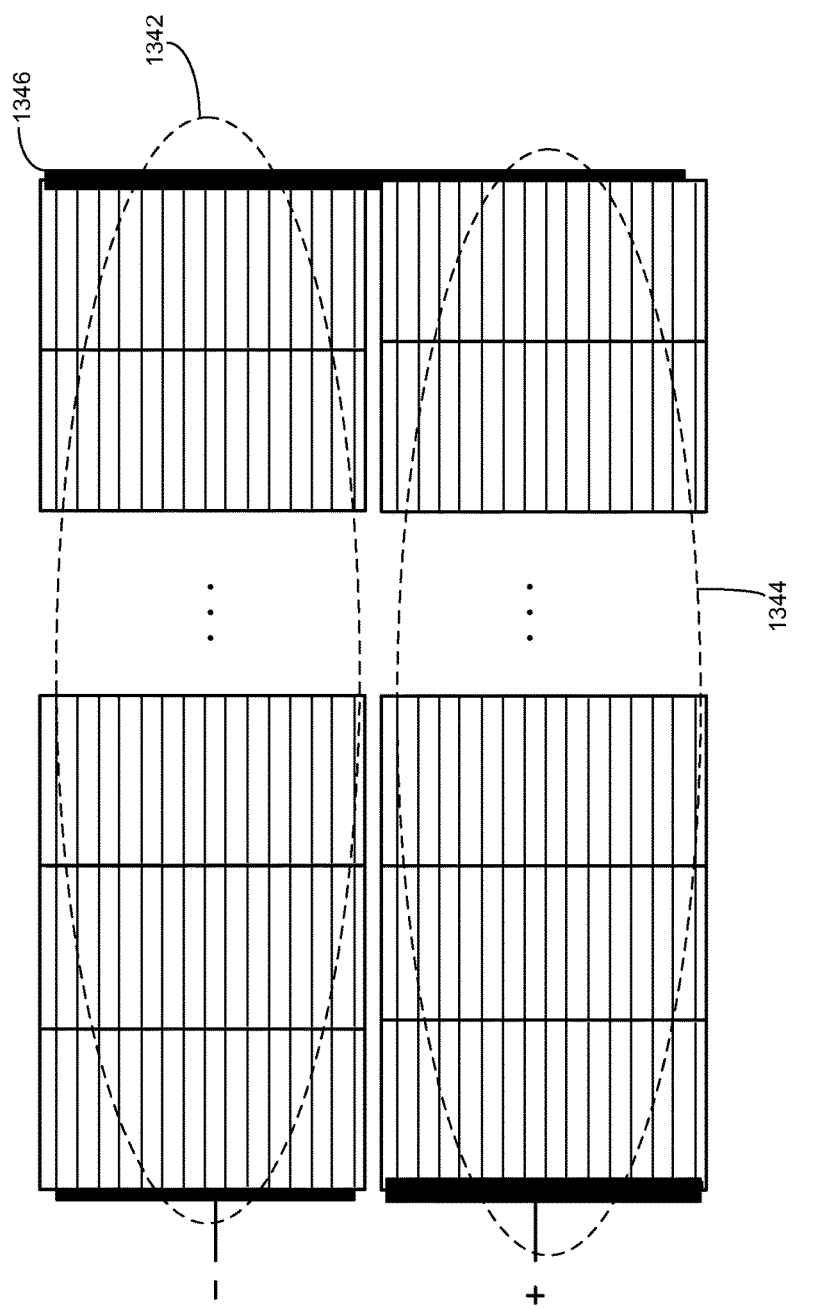

HIGH EFFICIENCY SOLAR PANEL

RELATED APPLICATION

This application claims the benefit of U.S. Provisional Application No. 62/075,134, entitled "HIGH EFFICIENCY SOLAR PANEL," by inventors Bobby Yang, Peter Nguyen, Jiunn Benjamin Heng, Anand J. Reddy, and Zheng Xu, filed 4 Nov. 2014.

This application is a continuation-in-part application of U.S. patent application Ser. No. 14/510,008, entitled "MODULE FABRICATION OF SOLAR CELLS WITH LOW RESISTIVITY ELECTRODES," by inventors Jiunn Benjamin Heng, Jianming Fu, Zheng Xu, and Bobby Yang, filed 8 Oct. 2014, which is a continuation-in-part application of U.S. patent application Ser. No. 14/153,608, entitled "MODULE FABRICATION OF SOLAR CELLS WITH LOW RESISTIVITY ELECTRODES," by inventors Jiunn Benjamin Heng, Jianming Fu, Zheng Xu, and Bobby Yang, filed 13 Jan. 2014, which claims the benefit of U.S. Provisional Application No. 61/751,733, entitled "Module Fabrication Using Bifacial Tunneling Junction Solar Cells with Copper Electrodes," by inventors Jiunn Benjamin Heng, Jianming Fu, Zheng Xu, and Bobby Yang, filed 11 Jan. 2013.

BACKGROUND

Field

This disclosure is generally related to the fabrication of a solar panel. More specifically, this disclosure is related to the fabrication of a solar panel with improved power output efficiency.

Related Art

The negative environmental impact of fossil fuels and their rising cost have resulted in a dire need for cleaner, cheaper alternative energy sources. Among different forms of alternative energy sources, solar power has been favored for its cleanness and wide availability.

A solar cell converts light into electricity using the photovoltaic effect. There are several basic solar cell structures, including a single p-n junction, p-i-n/n-i-p, and multi-junction. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal band gaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi-junction structure includes multiple single-junction structures of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit. High efficiency solar cells are essential in reducing cost to produce solar energies.

In practice, multiple individual solar cells are interconnected, assembled, and packaged together to form a solar panel, which can be mounted onto a supporting structure. Multiple solar panels can then be linked together to form a solar system that generates solar power. Depending on its scale, such a solar system can be a residential roof-top system, a commercial roof-top system, or a ground-mount utility-scale system. Note that, in such systems, in addition to the energy conversion efficiency of each individual cell, the ways cells are electrically interconnected within a solar panel also determine the total amount of energy that can be extracted from each panel. Due to the serial internal resistance resulted from the inter-cell connections an external load can only extra a limited percentage of the total power generated by a solar panel.

SUMMARY

One embodiment of the present invention provides a solar panel. The solar panel includes a plurality of solar cells, the solar cells arranged into a plurality of subsets, each subset comprising a number of solar cells. The solar cells in a subset are electrically coupled in series, and the subsets of solar cells are electrically coupled in parallel. The number of solar cells in a respective subset is sufficiently large such that the output voltage of the solar panel is substantially the same as an output voltage of a conventional solar panel with all of its substantially square shaped solar cells coupled in series.

In a variation on this embodiment, a respective solar cell in a subset is obtained by dividing a substantially square shaped solar cell.

In a further embodiment, the solar cell is obtained by dividing a substantially square shaped solar cell into three pieces.

In a variation on this embodiment, the number of solar cells in a subset is the same as the number of substantially square shaped solar cells coupled in series in the conventional solar panel.

In a variation on this embodiment, a respective solar cell is rectangular shaped.

In a variation on this embodiment, a respective solar cell is a double-sided tunneling heterojunction solar cell, which includes a base layer; first and second quantum tunneling barrier (QTB) layers deposited on both surfaces of the base layer; an amorphous silicon emitter layer; and an amorphous silicon surface field layer. In addition, the solar cell can absorb light from both surfaces.

In a variation on this embodiment, a respective solar cell comprises a first metal grid on a first side and a second metal grid on a second side, wherein the first metal grid comprises a first edge busbar located at an edge on the first side, and wherein the second metal grid comprises a second edge busbar located at an opposite edge on the second side of the solar cell.

In a further variation, the first metal grid and the second metal grid comprises an electroplated Cu layer.

In a further variation, two adjacent solar cells in a subset are positioned such that a first edge busbar of one solar cell is in direct contact with a second busbar of the other solar cell, thereby facilitating a serial connection between the two adjacent solar cells and eliminating uncovered space there between.

In a variation on this embodiment, the solar cells in a respective subset form a U-shaped string.

In a variation on this embodiment, the solar cells in the respective subset are physically coupled.

BRIEF DESCRIPTION OF THE FIGURES

FIG. 13C presents a diagram illustrating the top view of an exemplary solar cell string that includes two rows of smaller cells, in accordance with an embodiment of the present invention.

In the figures, like reference numerals refer to the same figure elements.

DETAILED DESCRIPTION

Figure 1:
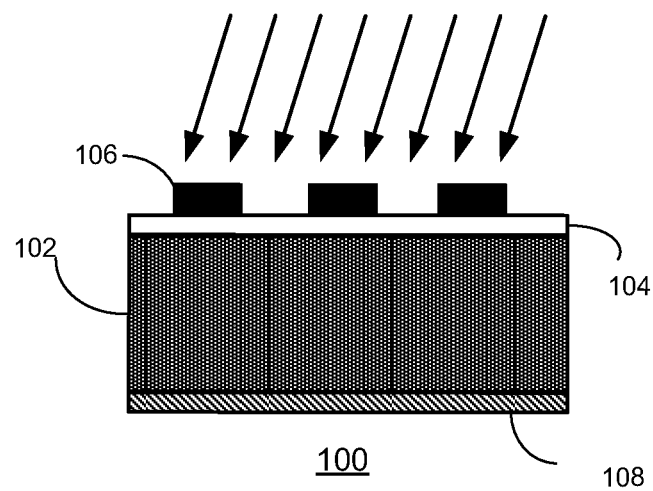
FIG. 1 presents a diagram illustrating an exemplary solar cell (prior art).

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a high-efficiency solar panel. To reduce the portion of power that is consumed by the internal resistance of a solar panel, the present inventive solar panel includes solar cell strings coupled in parallel. Moreover, to ensure the output compatibility between the present inventive solar panel and a conventional panel, each conventional square-shaped wafer, after the device structure is fabricated, is divided into a number of cut cells, which can be rectangular-shaped strips and can be serially coupled, so that the entire panel outputs substantially the same open-circuit voltage as a conventional panel. During the solar cell fabrication process, front and back metal grid patterns are specially designed to facilitate the division of a square-shaped wafer into cut cells. More specifically, spaces are reserved for the laser-based scribe-and-cleave operation. To reduce shading and to increase the packing factor, in some embodiments, the cells are connected in a shingled pattern. The performance of the solar panel can be further improved by applying maximum power point tracking (MPPT) technology and bypass protection at the cell or cell-group level. In some embodiments, a respective solar cell or group of solar cells within a solar panel is coupled to an MPPT integrated circuit (IC) chip and a bypass diode.

In this disclosure, the term "conventional solar cell" refers to a conventional, square-shaped or pseudo-square-shaped (with cut or rounded corners) solar cell, which is typically fabricated on a conventional wafer. Such conventional solar cells can also be referred to as "substantially square shaped" solar cells, meaning that the shape of a solar cell is a square or a pseudo square. The terms "cut cell," "strip," "smaller cell" refer to a solar cell that can be smaller than the conventional cell. Such a cell can be fabricated by cutting a conventional, square-shaped wafer into a number of pieces, or be directly fabricated on a wafer that has a size that is other than the size of a conventional wafer. Note that although such a uniquely shaped cell is sometimes referred to as a "smaller cell," it is not required that the size of such a cell is actually smaller than the size of a conventional cell. Other cell sizes, which can be larger and/or longer than a conventional cell size, are also possible.

Double Tunneling Heterojunction Solar Cells

Figure 2:
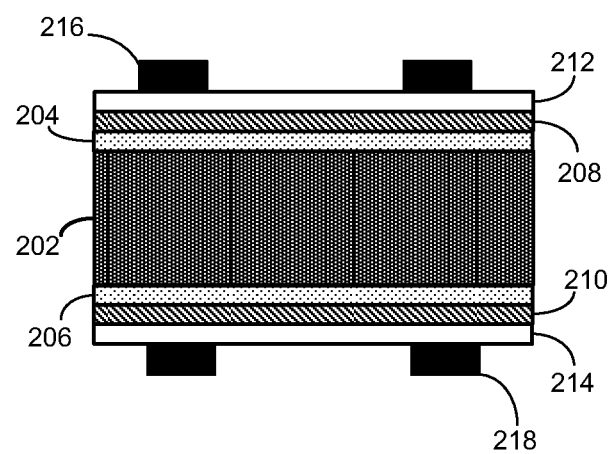
FIG. 2 presents a diagram illustrating an exemplary double-sided tunneling heterojunction solar cell, in accordance with an embodiment of the present invention.

FIG. 2 presents a diagram illustrating an exemplary double-sided tunneling heterojunction solar cell, in accordance with an embodiment of the present invention. In this example, a double-sided tunneling heterojunction solar cell 200 includes a single crystalline silicon base layer 202, quantum tunneling barrier (QTB) layers 204 and 206 covering both surfaces of base layer 202 and passivating the surface-defect states, a doped amorphous silicon (a-Si) layer 208 forming a surface field layer, a doped a-Si layer 210 forming an emitter layer, a first transparent conducting oxide (TCO) layer 212, a second TCO layer 214, a first metal grid 216, and a second metal grid 218. Note that solar cell 200 can operate with light incident on either side of both sides of the structure. In other words, solar cell 200 can operate with its surface field layer 208 facing the incident light, or with its emitter layer 210 facing the incident light. Solar cell 200 can also operate in a bifacial mode, meaning that both surface field layer 208 and emitter layer 210 can receive incident light. Details, including fabrication methods, about double-sided tunneling heterojunction solar cell 200 can be found in U.S. patent application Ser. No. 12/945,792, entitled "Solar Cell with Oxide Tunneling Junctions," by inventors Jiunn Benjamin Heng, Chentao Yu, Zheng Xu, and Jianming Fu, filed 12 Nov. 2010, the disclosure of which is incorporated by reference in its entirety herein.

In solar cells, the metallic contacts, such as metal grids 216 and 218, collect the current generated by the solar cell. In general, a metal grid includes two types of metal lines: fingers and busbars. Fingers are fine metal lines, usually laid out in parallel with substantially equal distance from one another, to collect current generated by the solar cell. Busbars are wider metal strips coupled to all the fingers to aggregate all the collected current and facilitate coupling to external leads (such as metal tabs). Note that the lay out pattern of fingers is not limited to lines. Loops and "snake" shaped lay out patterns can be used to reduce the chance of peeling-off of the metal grid.

Figure 3A:
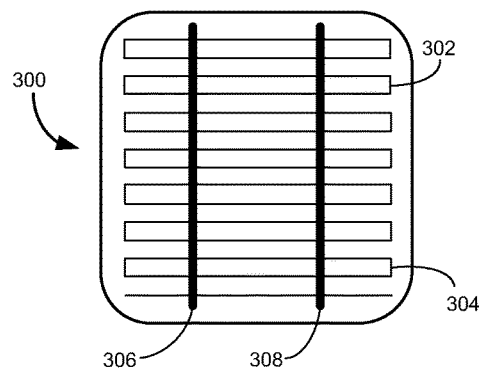
FIG. 3A presents a diagram illustrating the electrode grid of a conventional solar cell (prior art).

One factor in the metal grid design is the balance between the increased resistive losses associated with a widely spaced grid and the increased reflection and shading effect caused by the amount of metal coverage of the surface. In conventional solar cells, to mitigate power loss due to series resistance of the fingers, two busbars are typically used, as shown in FIG. 3A. For standardized 5-inch solar cells (which can be 5 inch×5 inch squares or pseudo squares with rounded corners), there are two busbars on each surface. For larger, 6-inch solar cells (which can be 6 inch×6 inch squares or pseudo squares with rounded corners), three or more busbars may be needed depending on the resistivity of the electrode materials. In the example illustrated in FIG. 3A the surface (which can be the front or back surface) of a solar cell 300 includes a plurality of parallel finger lines, such as finger lines 302 and 304, and two busbars 306 and 308 placed perpendicular to the finger lines. The busbars are placed in such a way as to ensure that the distance (and hence the resistance) from any point on a finger to a busbar is sufficiently small to mitigate power loss. However, these two busbars and the metal ribbons subsequently soldered onto these busbars for inter-cell connections can create a significant amount of shading, which reduces the solar cell performance.

In some embodiments of the present invention, the front and back metal grids, such as the finger lines, can include electroplated Cu lines. By using an electroplating or electroless plating technique, one can obtain Cu grid lines with a resistivity of equal to or less than $5 \times 10^{-6}$ $\Omega \cdot cm$. In addition, a metal seed layer (such as Ti) can be deposited directly on the TCO layer using, for example, a physical vapor deposition (PVD) process. This seed layer ensures excellent ohmic contact with the TCO layer as well as a strong physical bond with the solar cell structure. Subsequently, the Cu grid can be electroplated onto the seed layer. This two-layer (seed layer and electroplated Cu layer) ensures excellent ohmic contact quality, physical strength, low cost, and facilitates large-scale manufacturing. Details about an electroplated Cu grid (and optionally a metal seed layer deposited directly on the TCO layer) can be found in U.S. patent application Ser. No. 12/835,670, entitled "Solar Cell with Metal Grid Fabricated by Electroplating," by inventors Jianming Fu, Zheng Xu, Chentao Yu, and Jiunn Benjamin Heng, filed 13 Jul. 2010; U.S. patent application Ser. No. 13/679,913, entitled "SOLAR CELL WITH METAL GRID FABRICATED BY ELECTROPLATING," by inventors Bob Wen Kong and Jianming Fu, filed 16 Nov. 2012; and U.S. patent application Ser. No. 13/220,532, entitled "Solar Cell with Electroplated Metal Grid," by inventors Jianming Fu, Jiunn Benjamin Heng, Zheng Xu, and Chentao Yu, filed 29 Aug. 2011, the disclosures of which are incorporated by reference in their entirety herein.

The reduced resistance of the Cu fingers makes it possible to reduce the number of busbars on the solar cell surface. In some embodiments of the present invention, a single busbar is used to collect the current from the fingers.

Figure 3B:
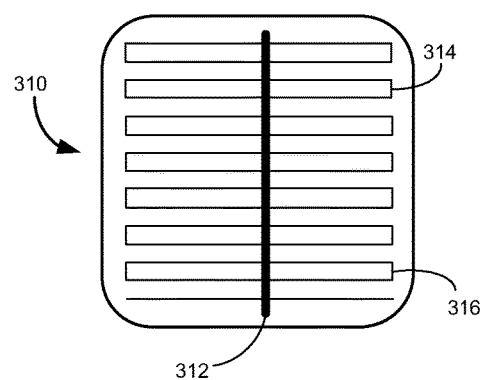
FIG. 3B illustrates the surface of an exemplary bifacial solar cell with a single center busbar, in accordance with an embodiment of the present invention.
Figure 3C:
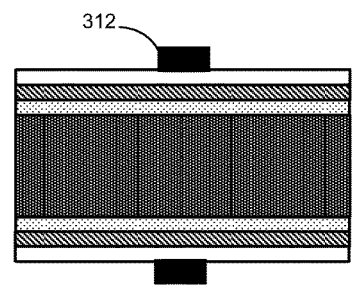
FIG. 3C presents a diagram illustrating a cross-sectional view of the bifacial solar cell with a single center busbar per surface, in accordance with an embodiment of the present invention.
Figure 3F:
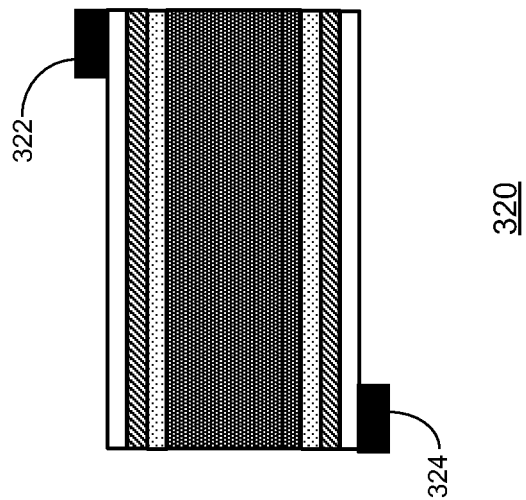
FIG. 3F illustrates a cross-sectional view of a bifacial solar cell with a single edge busbar per surface, in accordance with an embodiment of the present invention.
Figure 3E:
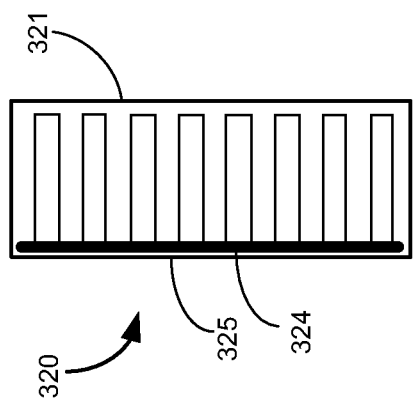
FIG. 3E illustrates the back surface of an exemplary bifacial solar cell, in accordance with an embodiment of the present invention.
Figure 3D:
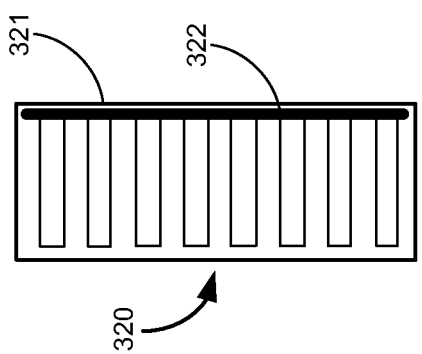
FIG. 3D illustrates the front surface of an exemplary bifacial solar cell, in accordance with an embodiment of the present invention.

FIG. 3B illustrates the surface of an exemplary bifacial solar cell with a single center busbar, in accordance with an embodiment of the present invention. In FIG. 3B, the front or back surface of a solar cell 310 includes a single busbar 312 and a number of finger lines, such as finger lines 314 and 316. FIG. 3C illustrates a cross-sectional view of the bifacial solar cell with a single center busbar per surface, in accordance with an embodiment of the present invention. The semiconductor multilayer structure shown in FIG. 3C can be similar to the one shown in FIG. 2. Note that the finger lines are not shown in FIG. 3C because the cut plane is between two finger lines. In the example shown in FIG. 3C, a busbar 312 runs in the direction that is perpendicular to the paper, and the finger lines run from left to right. Because there is only one busbar on each surface, the distances from the edges of the fingers to the busbar are longer. However, the elimination of one busbar reduces shading, which not only compensates for the power loss caused by the increased finger-to-busbar distance, but also provides additional power gain. FIG. 3D illustrates the front surface of an exemplary bifacial solar cell, in accordance with an embodiment of the present invention. In this example, the front surface of a cut solar cell 320 includes a number of horizontal finger lines and a vertical single busbar 322, which is placed adjacent to an edge 321 of solar cell 320. Busbar 322 is in contact with the rightmost edge of all the finger lines, and collects current from all the finger lines. FIG. 3E illustrates the back surface of solar cell 320. The back surface of solar cell 320 includes a number of horizontal finger lines and a vertical single busbar 324, which is placed adjacent to an edge 325 that is opposite to edge 321. Similar to busbar 322, busbar 324 is in contact with the edge of all the finger lines. FIG. 3F illustrates a cross-sectional view of bifacial solar cell 320. The semiconductor multilayer structure shown in FIG. 3F can be similar to the one shown in FIG. 2. Like FIG. 3C, in FIG. 3F, the finger lines (not shown) run from left to right, and the busbars run in the direction that is perpendicular the paper. As illustrated in FIGS. 3D-3F, the busbars on the front and the back surfaces of bifacial solar cell 320 are placed adjacent to opposite edges of the cell. This configuration can further improve power gain because the busbar-induced shading now occurs at locations that were less effective in energy production.

The single busbar configurations (either the center busbar or the edge busbar) not only can provide power gain, but also can reduce fabrication cost, because less metal will be needed. Moreover, the metal finger lines can have a cross-section with a curved profile to deflect incident light that otherwise would be blocked onto the cell surface, thus further reducing the shading effect. For bifacial operation, both the front and back covers of a solar panel can be transparent. These covers can be made from glass or polymer. Such bifacial panels can absorb light from both the "front" (facing sunlight) and "back" (facing away from the sunlight) surfaces, which allows the cell to convert both direct and indirect sunlight. Indirect sunlight can include reflected, deflected, and diffused sunlight from various surfaces surrounding the panel. Such bifacial solar panels are particularly useful in settings where the panels are elevated from a flat surface, such as in a solar farm environment.

Solar Panel Layout

Figure 4:
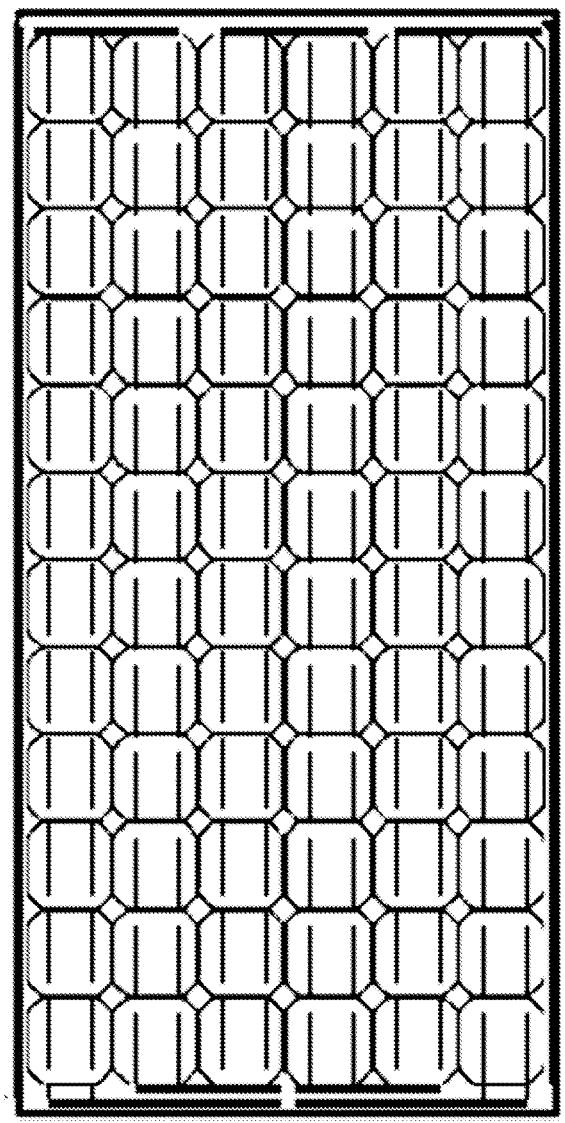
FIG. 4 presents a diagram illustrating a conventional solar panel that includes a plurality of solar cells connected in series (prior art).
Figure 5:
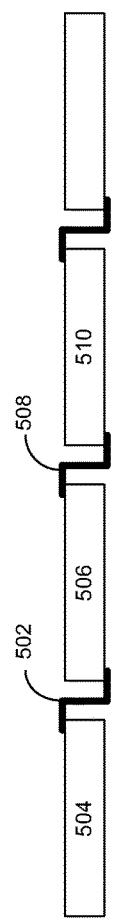
FIG. 5 presents a diagram illustrating the side view of a string of solar cells connected in series (prior art).

The open circuit voltage ($V_{oc}$) of a typical high efficiency solar cell can be approximately 750 mV. At the maximum power point (MPP), which is the desired operating point of the solar cell, the voltage across the solar cell is usually slightly lower than $V_{oc}$. In order to achieve a higher output voltage, conventional solar panels often include solar cells connected in series. FIG. 4 presents a diagram illustrating a conventional solar panel that includes a plurality of solar cells connected in series (prior art). FIG. 5 presents a diagram illustrating the side view of a string of solar cells connected in series (prior art). In the example illustrated in FIG. 5, metal tabs weave from the top side of a solar cell to the bottom side of an adjacent solar cell to achieve a serial connection. For example, a metal tab 502 connects the top side of a solar cell 504 to the bottom of an adjacent solar cell 506, and a metal tab 508 connects the top side of a solar cell 506 to the bottom side of an adjacent solar cell 510, forming a string of serially connected solar cells. A typical solar panel, such as a solar panel 400 shown in FIG. 4, may have all of its solar cells connected in series in such a way that solar cells in each row are connected in series, and the rows are also connected to each other in series. In order to do that, as shown in FIG. 4, the rightmost solar cell of the first row is serially connected to the rightmost solar cell of the second row. The serial connection zigzags through the entire panel until the last solar cell is connected.

Figure 6:
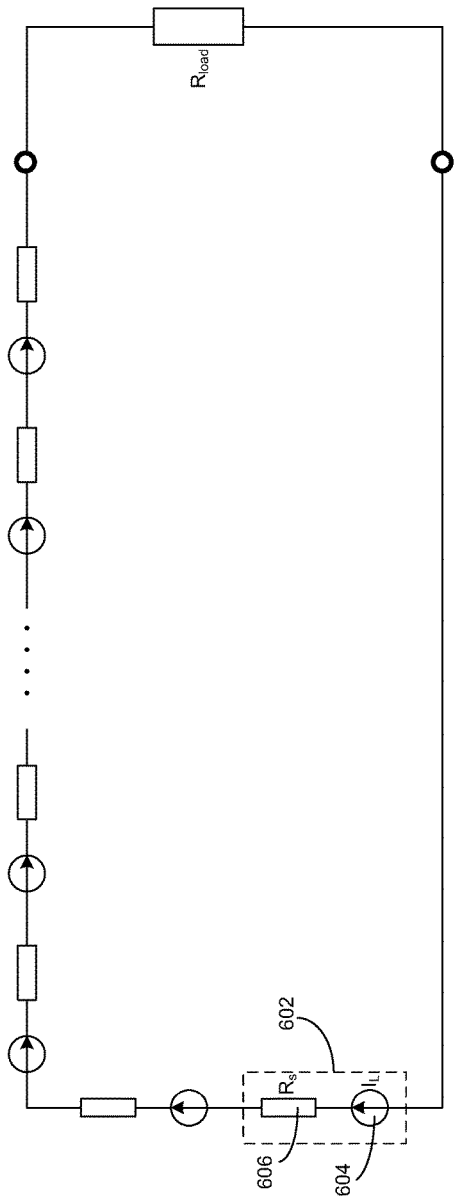
FIG. 6 presents a diagram illustrating a simplified equivalent circuit of a solar panel with serially connected solar cells.

FIG. 6 presents a diagram illustrating a simplified equivalent circuit of a solar panel with serially connected solar cells. In FIG. 6, each solar cell is represented by a current source with an internal resistance. For example, a solar cell 602 is represented by a current source 604 coupled in series with a resistor 606. When a solar panel includes serially connected solar cells, as shown in FIG. 6, the output power of the entire panel is determined by the total generated current ($I_{L\_total}$) and the sum of total internal resistance ($R_{s\_total}$) and external resistance (i.e., the load resistance, $R_{load}$). For example, if all solar cells are identical and receive the same amount of light, for n serially connected solar cells, $I_{L\_total}=I_L$ and $R_{s\_total}=nR_s$, and the total power generated by the entire circuit can be calculated as $P_{out}=I_L^2 \times (R_{s\_total}+R_{load})$. Assuming that the load resistance $R_{load}$ is adjusted by a maximum power point tracking (MPPT) circuit such that the total resistance for the entire circuit ($R_{s\_total}+R_{load}$) allows the entire panel to operate at the maximum power point (which means at a fixed $I_{L\_total}$), the amount of power extracted to the external load depends on the total internal resistance $R_{s\_total}$. In other words, a portion of the generated power is consumed by the serial internal resistance in the solar cells themselves: $P_R=I_L^2 \times nR_s$. In other words, the less the total internal resistance the entire panel has, the less power is consumed by the solar cells themselves, and the more power is extracted to the external load.

Figure 7:
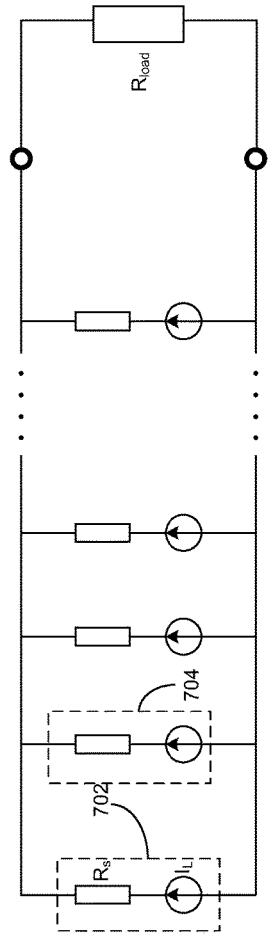
FIG. 7 presents a diagram illustrating a simplified equivalent circuit of a solar panel with parallelly connected solar cells, in accordance with one embodiment of the present invention.

One way to reduce the power consumed by the solar cells is to reduce the total internal resistance. Various approaches can be used to reduce the series resistance of the electrodes at the cell level. On the panel level, one effective way to reduce the total series resistance is to connect a number of cells in parallel, instead of connecting all the cells within a panel in series. FIG. 7 presents a diagram illustrating a simplified equivalent circuit of a solar panel with parallelly connected solar cells, in accordance with one embodiment of the present invention. In the example illustrated in FIG. 7, all solar cells, such as solar cells 702 and 704, are connected in parallel. As a result, the total internal resistance of the solar panel is $R_{s\_total}=R_s/n$, much smaller than the resistance of each individual solar cell. However, the output voltage $V_{load}$ is now limited by the open circuit voltage of a single solar cell, which is difficult in a practical setting to drive load, although the output current can be n times the current generated by a single solar cell.

Figure 8:
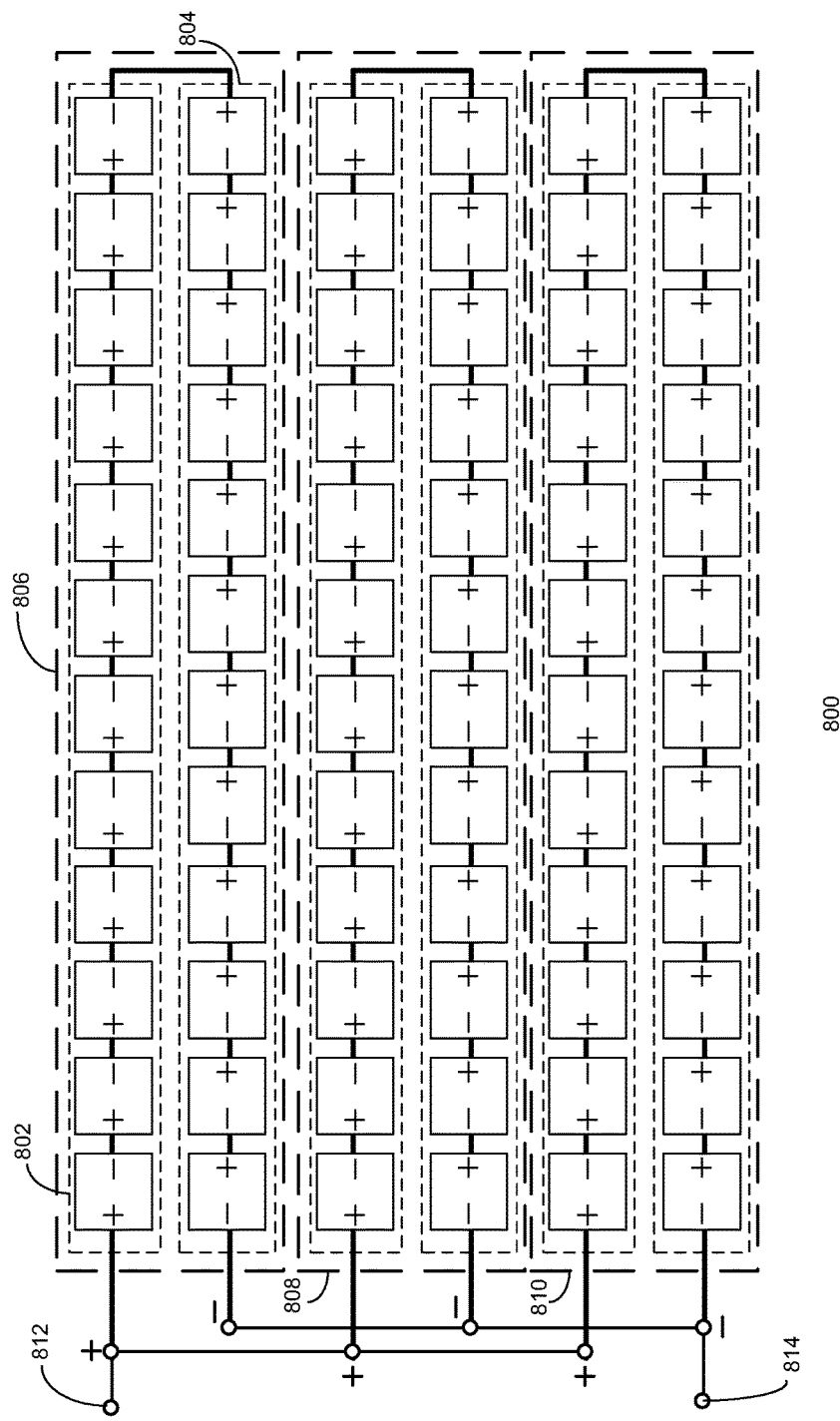
FIG. 8 presents a diagram illustrating an exemplary solar panel configuration, in accordance with an embodiment of the present invention.

In order attain an output voltage that is higher than that of the open circuit voltage of a single cell while reducing the total internal resistance for the panel, in some embodiments of the present invention, a subset of solar cells are connected into a string, and the multiple strings are connected in parallel. FIG. 8 presents a diagram illustrating an exemplary solar panel configuration, in accordance with an embodiment of the present invention. In the example shown in FIG. 8, a solar panel 800 include 72 solar cells arranged into six rows, such as a top row 802 and a second row 804, with each row including 12 cells. Each solar cell can be the standard 5- or 6-inch cell. For the purpose of illustration, each solar cell is marked with its anode and cathode on its edges, although in practice the anode and cathode of a solar cell are on its top and bottom side. In the example shown FIG. 8, solar cells in top row 802 and second row 804 are connected in series to form a U-shaped string 806. Similarly, the solar cells in the middle two rows are also connected in series to form a U-shaped string 808, and the solar cells in the bottom two rows are connected in series as well to form a U-shaped string 810. The three U-shaped strings 806, 808, and 810 are then connected to each other in parallel. More specifically, the positive outputs of all three strings are coupled together to form the positive output 812 of solar panel 800, and the negative outputs of all strings are coupled together to form the negative output 814 of solar panel 800.

By serially connecting solar cells in subsets to form strings and then parallelly connecting the strings, one can reduce the serial resistance of the solar panel to a fraction of that of a conventional solar panel with all the cells connected in series. In the example shown in FIG. 8, the cells on a panel are divided into three strings (two rows in each string) and the three strings are parallelly connected, resulting in the total internal resistance of solar panel 800 being ⅑ of a conventional solar panel that has all of its 72 cells connected in series. The reduced total internal resistance decreases the amount of power consumed by the solar cells, and allows more power to be extracted to external loads.

Parallelly connecting the strings also means that the output voltage of the panel is now the same as the voltage across each string, which is a fraction of the output voltage of a solar panel with all cells connected in series. In the example shown in FIG. 8, the output voltage of panel 800 is ⅓ of a solar panel that has all of its 72 cells connected in series.

Because the output voltage of each string is determined by the voltage across each solar cell (which is often slightly less than $V_{oc}$) and the number of serially connected cells in the string, one can increase the string output voltage by including more cells in each string. However, simply adding more cells in each row will result in an enlarged panel size, which is often limited due to various mechanical factors. Note that the voltage across each cell is mostly determined by $V_{oc}$, which is independent of the cell size. Hence, it is possible to increase the output voltage of each string by dividing each standard sized (5- or 6-inch) solar cell into multiple serially connected smaller cells. As a result, the output voltage of each string of solar cells is increased multiple times.

Figure 9:
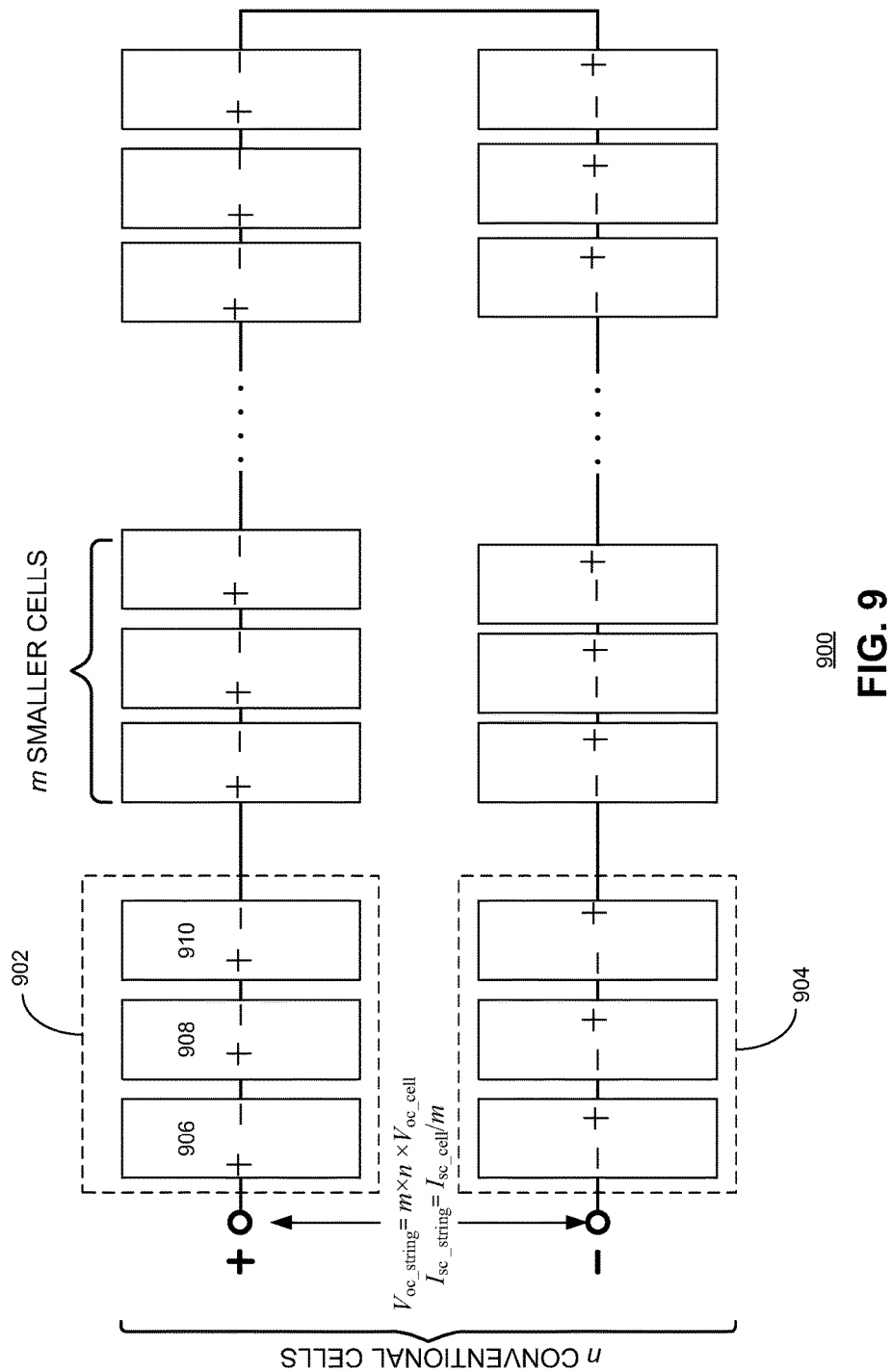
FIG. 9 presents a diagram illustrating a solar cell string with each solar cell being divided into multiple smaller cells, in accordance with an embodiment of the present invention.

FIG. 9 presents a diagram illustrating a solar cell string with each solar cell being divided into multiple smaller cells, in accordance with an embodiment of the present invention. In the example illustrated in FIG. 9, a solar cell string 900 includes a number of smaller cells. A conventional solar cell (such as the one represented by dotted line 902) is replaced by a number of serially connected smaller cells, such as cells 906, 908, and 910. For example, if the conventional solar cell is a 6-inch square cell, each smaller cell can have a dimension of 2-inch by 6-inch, and a conventional 6-inch square cell is replaced by three 2-inch by 6-inch smaller cells connected in series. Note that, as long as the layer structure of the smaller cells remains the same as the conventional square-sized solar cell, the smaller cell will have the same $V_{oc}$ as that of the undivided solar cell. On the other hand, the current generated by each smaller cell is only a fraction of that of the original undivided cell due to its reduced size. Furthermore, the output current by solar cell string 900 is a fraction of the output current by a conventional solar cell string with undivided cells. The output voltage of the solar cell strings is now three times that of a solar string with undivided cells, thus making it possible to have parallelly connected strings without sacrificing the output voltage.

Now assuming that the open circuit voltage ($V_{oc}$) across a standard 6-inch solar cell is $V_{oc\_cell}$, then the $V_{oc}$ of each string is m×n×$V_{oc\_cell}$, wherein m is the number of smaller cells as the result of dividing a conventional square shaped cell, and n is the number of conventional cells included in each string. On the other hand, assuming that the short circuit current ($I_{sc}$) for the standard 6-inch solar cell is $I_{sc\_cell}$, then the $I_{sc}$ of each string is $I_{sc\_cell}$/m. Hence, when m such strings are connected in parallel in a new panel configuration, the $V_{oc}$ for the entire panel will be the same as the $V_{oc}$ for each string, and the $I_{sc}$ for the entire panel will be the sum of the $I_{sc}$ of all strings. More specifically, with such an arrangement, one can achieve: $V_{oc\_panel}$=m×n×$V_{oc\_cell}$ and $I_{sc\_panel}$=$I_{sc\_cell}$. This means that the output voltage and current of this new solar panel will be comparable to the output voltage and current of a conventional solar panel of a similar size but with undivided solar cells all connected in series. The similar voltage and current outputs make this new panel compatible with other devices, such as inverters, that are used by a conventional solar panel with all its undivided cells connected in series. Although having similar current and voltage output, the new solar panel can extract more output power to external load because of the reduced total internal resistance.

Figure 10:
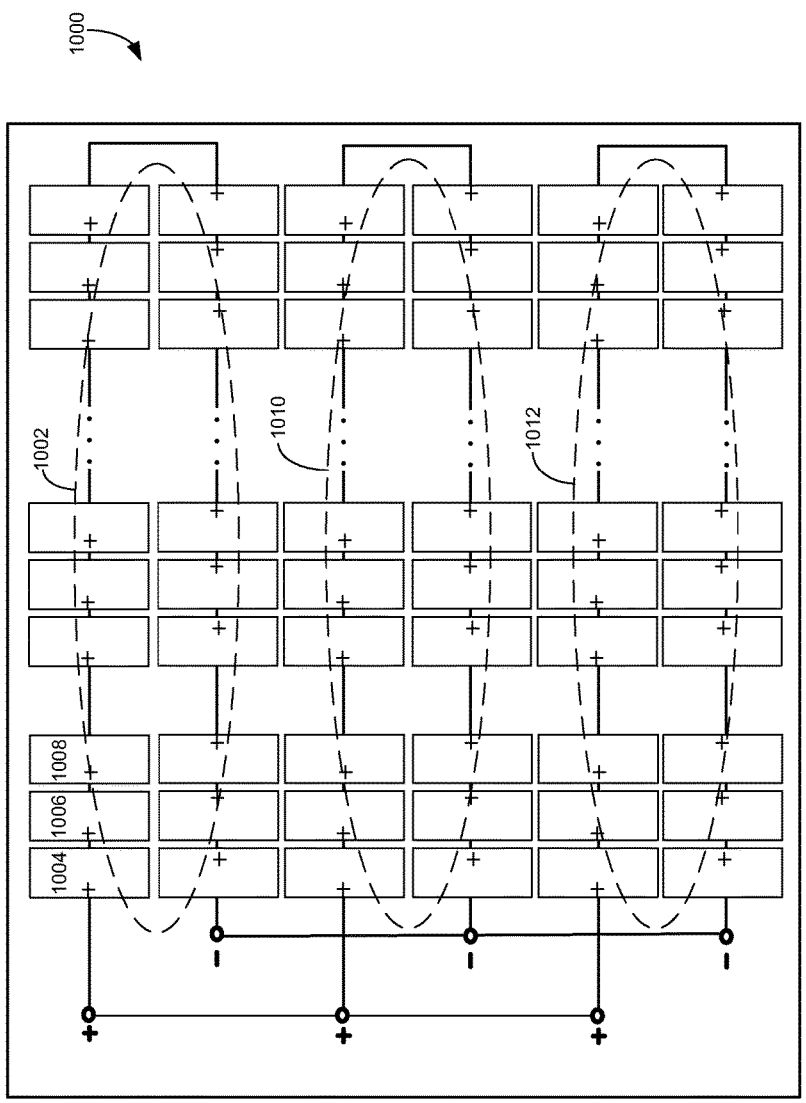
FIG. 10 presents a diagram illustrating an exemplary solar panel, in accordance with an embodiment of the present invention.

FIG. 10 presents a diagram illustrating an exemplary solar panel, in accordance with an embodiment of the present invention. In this example, solar panel 1000 includes arrays of solar cells that are arranged in a repeated pattern, such as a matrix that includes a plurality of rows. In some embodiments, solar panel 1000 includes six rows of inter-connected smaller cells, with each row including 36 smaller cells. Note that each smaller cell is approximately ⅓ of a 6-inch standardized solar cell. For example, smaller cells 1004, 1006, and 1008 are evenly divided portions of a standard-sized cell. Solar panel 1000 is configured in such a way that every two adjacent rows of smaller cells are connected in series, forming three U-shaped strings. In FIG. 10, the top two rows of smaller cells are connected in series to form a solar string 1002, the middle two rows of smaller cells are connected in series to form a solar string 1010, and the bottom two rows of smaller cells are connected in series to form a solar string 1012.

In the example shown in FIG. 10, solar panel 1000 includes three U-shaped strings with each string including 72 smaller cells. The $V_{oc}$ and $I_{sc}$ of the string are 72$V_{oc\_cell}$ and $I_{sc\_cell}$/3, respectively; and the $V_{oc}$ and $I_{sc}$ of the panel are 72 $V_{oc\_cell}$, and $I_{sc\_cell}$, respectively. Such panel level $V_{oc}$ and $I_{sc}$ are similar to those of a conventional solar panel of the same size with all its 72 cells connected in series, making it possible to adopt the same circuit equipment developed for the conventional panels.

Furthermore, the total internal resistance of panel 1000 is significantly reduced. Assume that the internal resistance of a conventional cell is $R_{cell}$. The internal resistance of a smaller cell is $R_{small\_cell}$=$R_{cell}$/3. In a conventional panel with 72 conventional cells connected in series, the total internal resistance is 72 $R_{cell}$. In panel 1000 as illustrated in FIG. 10, each string has a total internal resistance $R_{string}$=72 $R_{small\_cell}$=24 $R_{cell}$. Since panel 1000 has 3 U-shaped strings connected in parallel, the total internal resistance for panel 1000 is $R_{string}$/3=8 $R_{cell}$, which is ⅑ of the total internal resistance of a conventional panel. As a result, the amount of power that can be extracted to external load can be significantly increased.

Fabrication Process

Figure 11:
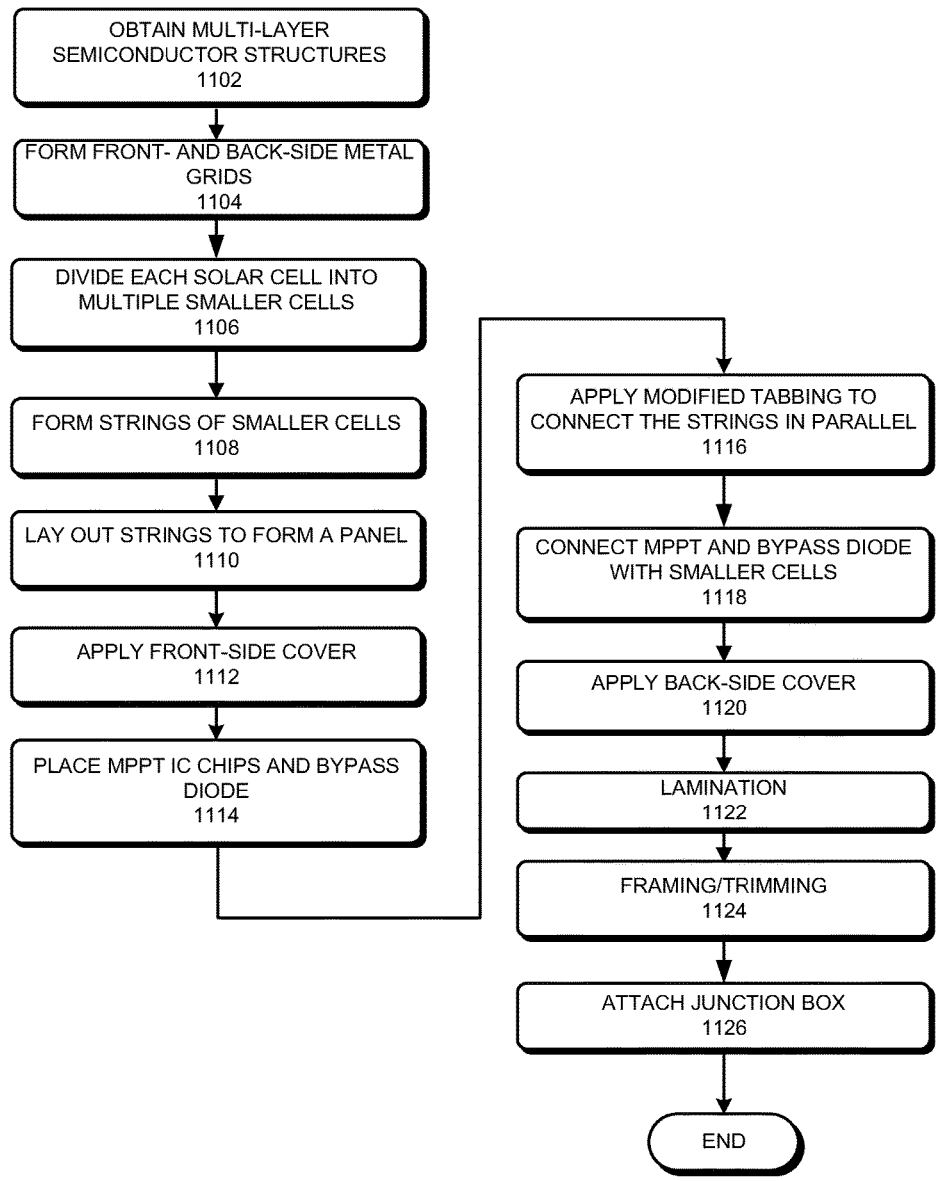
FIG. 11 presents a flow chart illustrating the process of fabricating a solar panel, in accordance with an embodiment of the present invention.

FIG. 11 presents a flow chart illustrating the process of fabricating a solar panel, in accordance with an embodiment of the present invention. During fabrication, conventional solar cells comprising multi-layer semiconductor structures are first fabricated using conventional wafers (operation 1102). In some embodiments, the multi-layer semiconductor structure can include a double-sided tunneling heterojunction solar cell. The solar cells can have a standard size, such as the standard 5-inch or 6-inch squares. In some embodiments, the solar cells are 6×6 inch square-shaped cells. Subsequently, front- and back-side metal grids are deposited on the front and back surfaces of the solar cells respectively to complete the bifacial solar cell fabrication (operation 1104). In some embodiments, depositing the front- and back-side metal grids may include electroplating of a Cu grid, which is subsequently coated with Ag or Sn. In further embodiments, one or more seed metal layers, such as a seed Cu or Ni layer, can be deposited onto the multi-layer structures using a physical vapor deposition (PVD) technique to improve adhesion and ohmic contact quality of the electroplated Cu layer. Different types of metal grids can be formed, including, but not limited to: a metal grid with a single busbar at the center and a metal grid with a single busbar at the cell edge. Note that for the edge-busbar configuration, the busbars at the front and back surfaces of the solar cells are placed at opposite edges, respectively.

Because the standard 5- or 6-inch solar cells will later be divided into smaller cells, which can involve a laser-based scribe-and-cleave process, special patterns for the metal grid are used. First, the metal grid layout allows a conventional cell to be divided into multiple smaller cells. Second, due to the malleability of the Cu grid, it can be difficult to cleave a wafer across the Cu grid lines. Therefore, as illustrated in FIGS. 12A and 12B, when depositing the metal grid, blank spaces can be reserved to facilitate the subsequent cell-dividing process.

Figure 12A:
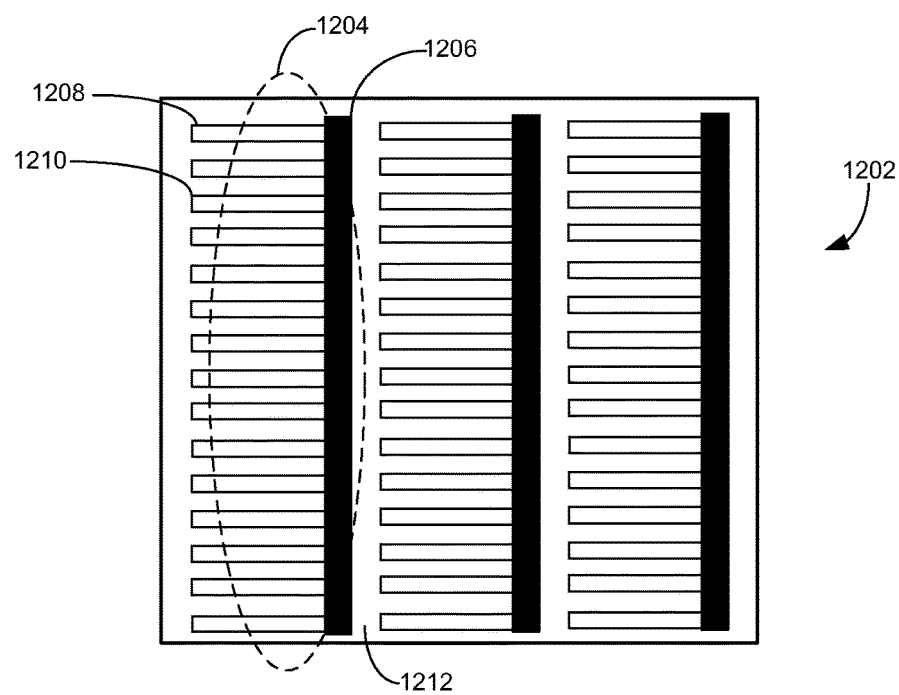
FIG. 12A presents a diagram illustrating an exemplary metal grid pattern on the front surface of a solar cell, in accordance with an embodiment of the present invention.

FIG. 12A presents a diagram illustrating an exemplary metal grid pattern on the front surface of a solar cell, in accordance with an embodiment of the present invention. In the example shown in FIG. 12A, metal grid 1202 includes three sub-grids, such as sub-grid 1204. Note that each sub-grid is designed to be the front-side grid for the smaller cell. Hence, the three sub-grid configuration allows the solar cell to be divided into three smaller cells. Various types of metal grid patterns can be used for each sub-grid, such as a conventional grid pattern with double busbars, a single center busbar grid pattern, a single edge busbar grid pattern, etc. In the example shown in FIG. 12A, the sub-grids have a single edge busbar pattern. Each sub-grid includes an edge busbar running along the longer edge of the corresponding smaller cell and a plurality of parallel finger lines running in a direction parallel to the shorter edge of the smaller cell. For example, sub-grid 1204 includes an edge busbar 1206, and a plurality of finger lines, such as finger lines 1208 and 1210. To facilitate the subsequent laser-based scribe-and-cleave process, a predefined blank space (with no metal deposition) is placed between the adjacent sub-grids. For example, a blank space 1212 is defined to separate sub-grid 1204 from its adjacent sub-grid. In some embodiments, the width of the blank space, such as blank space 1212, can be between 0.5 mm and 2 mm. Note that there is a tradeoff between a wider space that leads to an easier scribing operation and a narrower space that leads to more effective current collection. In a further embodiment, the width of such a blank space is 1 mm.

Figure 12B:
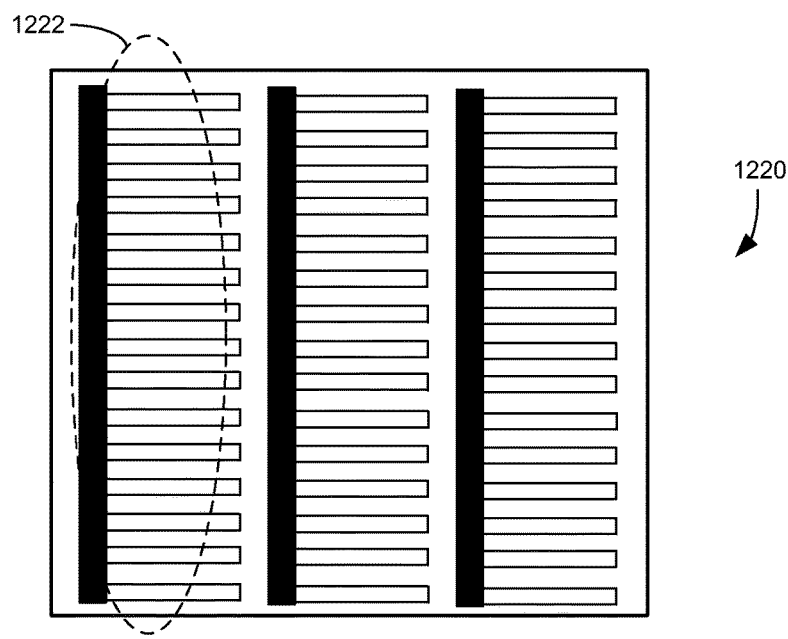
FIG. 12B presents a diagram illustrating an exemplary metal grid pattern on the back surface of a solar cell, in accordance with an embodiment of the present invention.

FIG. 12B presents a diagram illustrating an exemplary metal grid pattern on the back surface of a solar cell, in accordance with an embodiment of the present invention. In the example shown in FIG. 12B, back metal grid 1220 includes three sub-grids, such as a sub-grid 1222. Note that for the smaller cells to be bifacial, the backside sub-grid needs to correspond to the frontside sub-grid. In this example, the frontside sub-grid has a single edge busbar grid pattern. Hence, the corresponding backside sub-grid, such as sub-grid 1222, also has an edge busbar pattern. The front and backside sub-grids have similar patterns except that the front and back edge busbars are located adjacent to opposite edges of the smaller cell. In the example shown in FIGS. 12A and 12B, the front edge busbar is located at one edge of the front surface of the smaller cell, and the back edge busbar is located at the opposite edge of the back surface of the smaller cell. In addition, the locations of the blank spaces in back metal grid 1220 correspond to locations of the blank spaces in front metal grid 1202, such that the Cu grid lines do not interfere with the subsequent wafer-cutting process.

Now returning to FIG. 11, subsequent to depositing the front and back metal grid, each solar cell is divided into multiple smaller cells (operation 1106). Various techniques can be used to divide the cells. In some embodiments, a laser-based scribe-and-cleave technique is used. More specifically, a high-power laser beam is used to scribe the surface of the solar cell at the desired locations (such as blank space 1212) to a pre-determined depth (such as 20% of the total stack thickness), followed by applying appropriate force to cleave the scribed solar cell into multiple smaller cells. Note that, in order to prevent damage to the emitter junction, it is desirable to apply the laser scribing at the solar cell surface corresponding to the surface field layer. For example, if the emitter junction is at the front surface of the solar cell, the laser scribing should be applied to the back surface of the solar cell.

After the formation of the smaller cells, a number of smaller cells are connected together in series to form a solar cell string (operation 1108). In some embodiments, two rows of smaller cells with each row including 32 smaller cells are connected in series to form a U-shaped string. Note that, depending on the busbar configuration, the conventional stringing process may need to be modified. For the single edge-busbar configuration as shown in FIGS. 12A and 12B, each solar cell needs to be rotated 90 degrees, and a single tab that is as long as the long edge of the smaller cell and is between 3 and 12 mm in width can be used to connect two adjacent smaller cells. In some embodiments, the width of the single tab can be between 3 and 5 mm. Detailed descriptions of connecting two adjacent smaller cells using a single tab can be found in U.S. patent application Ser. No. 14/153,608, entitled "MODULE FABRICATION OF SOLAR CELLS WITH LOW RESISTIVITY ELECTRODES," by inventors Jiunn Benjamin Heng, Jianming Fu, Zheng Xu, and Bobby Yang and filed 13 Jan. 2014, the disclosure of which is incorporated by reference in its entirety herein.

Figure 13A:
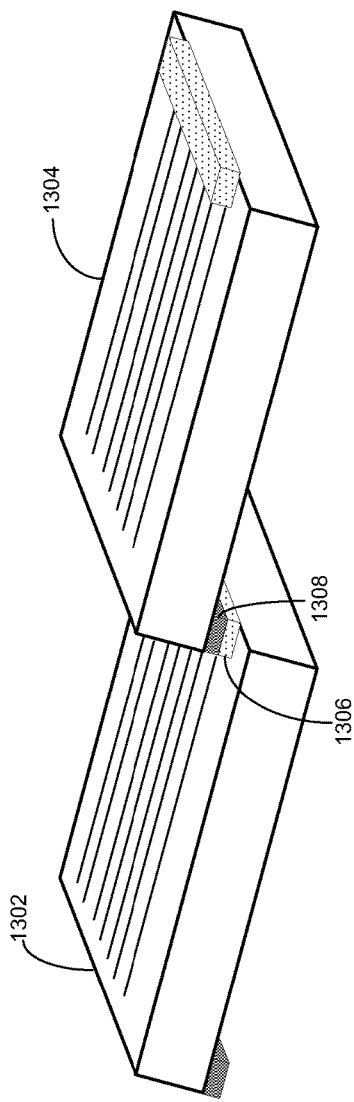
FIG. 13A presents a diagram illustrating the serial connection between two adjacent smaller cells with a single edge busbar per surface, in accordance with an embodiment of the present invention.

In addition to using a single tab to connect adjacent smaller cells in series, in some embodiments, the serial connection between adjacent smaller cells is achieved by partially overlapping the adjacent smaller cells, thus resulting in the direct contact of the corresponding edge busbars. FIG. 13A presents a diagram illustrating the serial connection between two adjacent smaller cells with a single edge busbar per surface, in accordance with an embodiment of the present invention. In FIG. 13A, smaller cell 1302 and smaller cell 1304 are coupled to each other via an edge busbar 1306 located at the top surface of smaller cell 1302 and an edge busbar 1308 located the bottom surface of smaller cell 1304. More specifically, the bottom surface of smaller cell 1304 partially overlaps with the top surface of smaller cell 1302 at the edge in such a way that bottom edge busbar 1308 is placed on top of and in direct contact with top edge busbar 1306.

In some embodiments, the edge busbars that are in contact with each other are soldered together to enable the serial electrical connection between adjacent smaller cells. In further embodiments, the soldering may happen concurrently with a lamination process, during which the edge-overlapped smaller cells are placed in between a front-side cover and a back-side cover along with appropriate sealant material, which can include adhesive polymer, such as ethylene vinyl acetate (EVA). During lamination, heat and pressure are applied to cure the sealant, sealing the solar cells between the front-side and back-side covers. The same heat and pressure can result in the edge busbars that are in contact, such as edge busbars 1306 and 1308, being soldered together. Note that if the edge busbars include a top Sn layer, there is no need to insert additional soldering or adhesive materials between the top and bottom edge busbars (such as edge busbars 1306 and 1308) of adjacent solar cells. Also note that because the smaller cells are relatively flexible, the pressure used during the lamination process can be relatively large without the worry that the cells may crack under such pressure. In some embodiments, the pressure applied during the lamination process can be above 1.0 atmospheres, such as 1.2 atmospheres.

Figure 13B:
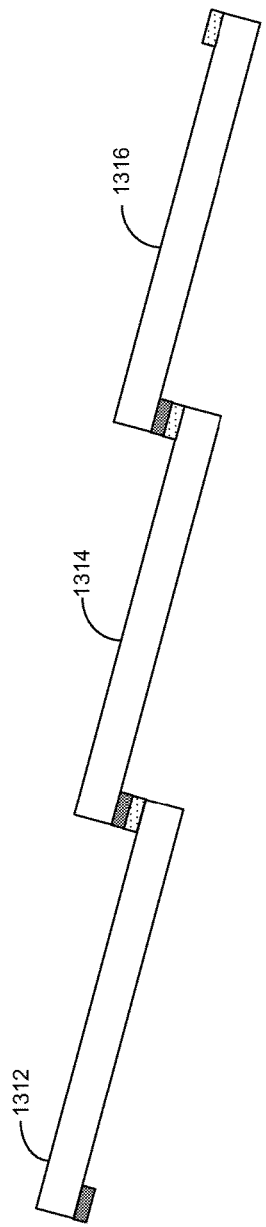
FIG. 13B presents a diagram illustrating the side-view of a string of adjacent edge-overlapped smaller cells, in accordance with an embodiment of the present invention.

FIG. 13B presents a diagram illustrating the side-view of a string of adjacent edge-overlapped smaller cells, in accordance with an embodiment of the present invention. In FIG. 13B, a smaller cell 1312 partially overlaps adjacent smaller cell 1314, which also partially overlaps (on its opposite end) smaller cell 1316. Such a string of smaller cells forms a pattern that is similar to roof shingles. Note that, in some embodiments, the three smaller cells shown in FIG. 13B are in fact parts of a standard 6-inch square solar cell, with each smaller cell having a dimension of 2 inches by 6 inches. Compared with an undivided 6-inch solar cell, the partially overlapped smaller cells provide roughly the same photo-generation area but can lead to less power being consumed by the series resistance due to the reduced current. The overlapping should be kept to a minimum to minimize shading caused by the overlapping. In some embodiments, the single busbars (both at the top and the bottom surface) are placed at the very edge of the smaller cell (as shown in FIG. 13B), thus minimizing the overlapping. The same shingle pattern can extend along all smaller cells in a row. To ensure that smaller cells in two adjacent rows are connected in series, the two adjacent rows need to have opposite shingle patterns, such as right-side on top for one row and left-side on top for the adjacent row. Moreover, an extra wide metal tab can be used to serially connect the end smaller cells at the two adjacent rows. Detailed descriptions of serially connecting solar cells in a shingled pattern can be found in U.S. patent application Ser. No. 14/510,008, entitled "MODULE FABRICATION OF SOLAR CELLS WITH LOW RESISTIVITY ELECTRODES," by inventors Jiunn Benjamin Heng, Jianming Fu, Zheng Xu, and Bobby Yang and filed 8 Oct. 2014, the disclosure of which is incorporated by reference in its entirety herein.

Note that although the examples above illustrate adjacent solar cells being physically coupled with direct contact in a "shingling" configuration, in some embodiments of the present invention the adjacent solar cells can also be coupled electrically in series using conductive materials without being in direct contact with one another.

FIG. 13C presents a diagram illustrating the top view of an exemplary solar cell string that includes two rows of smaller cells, in accordance with an embodiment of the present invention. In FIG. 13C, a string 1340 includes two rows of smaller cells, a top row 1342 and a bottom row 1344. Each row includes a plurality of smaller cells arranged in a shingled pattern. The serial connection is made by the overlapped edge busbars. As a result, when viewing from the top, no busbar can be seen on each smaller cell. Therefore, this configuration can also be referred to as the "no-busbar" configuration. In FIG. 13C, at the right end of the rows, an extra wide metal tab 1346 couples together the top edge busbar of the end smaller cell of row 1342 to the bottom edge busbar of the end smaller cell of row 1344. At the left end of the rows, lead wires can be soldered onto the top and bottom edge busbars of the end smaller cells, forming the output electrode of string 1340 to enable electrical connections between string 1340 and other strings.

Returning to FIG. 11, subsequent to the formation of multiple strings of smaller cells, the multiple solar strings are laid out next to each other to form a panel (operation 1110). In some embodiments, three U-shaped strings are laid out next to each other to form a panel that includes 6 rows of smaller cells. After laying out the strings, the front-side cover is applied (operation 1112). In some embodiments, the front-side cover is made of glass.

For solar modules implementing cell-level MPPT or cell-level bypass protection, the MPPT IC chips and bypass diode can be placed at appropriate locations, including, but not limited to: corner spacing between solar cells, and locations between adjacent solar cells (operation 1114). In some embodiments, the MPPT IC chips and bypass diode may be implemented at a multi-cell level or string level. In some embodiments, each row of smaller cells may be coupled to an MPPT IC and/or a bypass diode.

The U-shaped strings are then connected to each other via a modified tabbing process (operation 1116). More specifically, the strings are connected to each other in parallel with their positive electrodes coupled together to form the positive output of the panel and negative electrodes coupled together to form the negative output of the panel. Electrical connections between the MPPT IC chips and bypass diodes and the corresponding smaller cell electrodes are formed to achieve a completely interconnected solar panel (operation 1118). Subsequently, the back-side cover is applied (operation 1120), and the entire solar panel can go through the normal lamination process, which would seal the cells, the MPPT ICs, and the bypass diode in place (operation 1122). Note that to ensure superior bifacial performance, the back-side cover is also made of glass. The lamination process is then followed by framing and trimming (operation 1124), and the attachment of a junction box (operation 1126).

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A solar panel, comprising:
   a plurality of solar cell strips arranged into m subsets, wherein m is an integer greater than one;
   wherein a respective solar cell strip has a rectangular shape with a long edge and a short edge, and wherein a length of the long edge is substantially m times that of the short edge,
   wherein solar cell strips in a respective subset are electrically coupled in series; and
   wherein the m subsets of solar cell strips are electrically coupled in parallel.

2. The solar panel of claim 1, wherein the solar cell strip is obtained by dividing a substantially square shaped solar cell into three pieces.

3. The solar panel of claim 1, wherein a respective subset comprises solar cell strips obtained by dividing n substantially square shaped solar cells into m×n strips, with each substantially square shaped solar cell being divided into m strips.

4. The solar panel of claim 1, wherein the solar cell strip is a double-sided tunneling heterojunction photovoltaic structure, which includes:
   a base layer;
   first and second quantum tunneling barrier (QTB) layers deposited on both surfaces of the base layer;
   an amorphous silicon emitter layer; and
   an amorphous silicon surface field layer;
   wherein the solar cell can absorb light from both surfaces.

5. The solar panel of claim 1, wherein the solar cell strip comprises a first metal grid on a first side and a second metal grid on a second side, wherein the first metal grid comprises a first edge busbar located at an edge on the first side, and wherein the second metal grid comprises a second edge busbar located at an opposite edge on the second side of the solar cell.

6. The solar panel of claim 5, wherein the first metal grid and the second metal grid comprises an electroplated Cu layer.

7. The solar panel of claim 5, wherein two adjacent solar cell strips in a subset are positioned such that a first edge busbar of one solar cell strip is in direct contact with a second edge busbar of the other solar cell strip, thereby facilitating a serial connection between the two adjacent solar cell strips and eliminating uncovered space there between.

8. The solar panel of claim 1, wherein the solar cell strips in a respective subset form a U-shaped string.

9. The solar panel of claim 1, wherein the solar cell strips in the respective subset are physically coupled.

* * * * *